(12) United States Patent
Yeom et al.

(10) Patent No.: US 7,060,931 B2
(45) Date of Patent: Jun. 13, 2006

(54) NEUTRAL BEAM SOURCE HAVING ELECTROMAGNET USED FOR ETCHING SEMICONDUCTOR DEVICE

(75) Inventors: Geun-Young Yeom, Seoul (KR); Do-Haing Lee, Kyeonggi-do (KR); Byoung Jac Park, Chungcheongnam-do (KR)

(73) Assignee: Sungkyunkwan University, Seoul (KR)

( * ) Notice: Subject to any disclaimer, the term of this patent is extended or adjusted under 35 U.S.C. 154(b) by 34 days.

(21) Appl. No.: 10/825,099

(22) Filed: Apr. 16, 2004

(65) Prior Publication Data

US 2005/0194361 A1    Sep. 8, 2005

(30) Foreign Application Priority Data

Mar. 5, 2004    (KR)    ............... 10-2004-0014977

(51) Int. Cl.
*B23K 9/00*    (2006.01)

(52) U.S. Cl. ................. 219/121.36; 219/121.43; 118/723 MA

(58) Field of Classification Search ........ 219/678–680, 219/121.36, 121.39, 121.4, 121.43, 121.47; 156/345 P, 345 MG; 118/723 MA, 723 MR
See application file for complete search history.

(56) References Cited

U.S. PATENT DOCUMENTS

| | | | | |
|---|---|---|---|---|
| 3,911,318 A | * | 10/1975 | Spero et al. ................... 315/39 |
| 4,939,424 A | * | 7/1990 | Kieser et al. ......... 118/723 MA |
| 4,960,073 A | * | 10/1990 | Suzuki et al. ......... 118/723 MR |
| 4,990,789 A | * | 2/1991 | Uesaki ................... 250/504 R |
| 5,234,526 A | * | 8/1993 | Chen et al. ............ 156/345.42 |
| 5,451,290 A | * | 9/1995 | Salfelder ...................... 216/67 |
| 6,245,190 B1 | * | 6/2001 | Masuda et al. ...... 118/723 MA |
| 2004/0016876 A1 | | 1/2004 | Yeom et al. |

OTHER PUBLICATIONS

Korean Patent Abstracts (KR), abstract of G.Y. Yeom "Ion Flux Improved Ion Beam Source," Korea 10-2002-0092482 (Dec. 12, 2002) abstract only.
Korean Patent Abstracts (KR), abstract of M.J. Jung et al. "Etch Apparatus Using Neutral Beam," Korea 10-2003-0042958 (Jun. 2, 2003) abstract only.

* cited by examiner

*Primary Examiner*—Tu Hoang
(74) *Attorney, Agent, or Firm*—Foley & Lardner LLP

(57) ABSTRACT

Disclosed is a neutral beam source used for etching a semiconductor device. The neutral beam source includes a plasma chamber having quartz provided at an outer wall thereof with an RF coil, a grid assembly, a reflective member, and an electromagnet arranged around the plasma chamber while surrounding the plasma chamber. Plasma density becomes high due to the magnetic field applied to the plasma chamber so that an amount of ion flux is increased.

8 Claims, 5 Drawing Sheets

NEUTRAL BEAM SOURCE HAVING ELECTROMAGNET USED FOR ETCHING SEMICONDUCTOR DEVICE

BACKGROUND OF THE INVENTION

1. Field of the Invention

The present invention relates to a neutral beam source having an electromagnet, and more particularly to a neutral beam source having an electromagnet used for etching a semiconductor device and capable of obtaining a great amount of ion flux at low energy by improving a structure of a plasma chamber of a conventional neutral beam source converting ion beams into neutral beams.

2. Description of the Prior Art

As generally known in the art, an ion beam source is used in various technical fields requiring a uniform beam distribution over a large area. Particularly, such an ion beam source has been widely used in a semiconductor field, so as to implant impurities into a semiconductor substrate, deposit a predetermined material layer on the semiconductor substrate, or etch a predetermined material layer formed on the semiconductor substrate. Herein, the ion beam source ionizes gas and supplies ionized gas into a required place by accelerating ionized gas extracted from a plasma chamber.

Applicant of the present invention has filed a patent application entitled "Ion beam source capable of improving ion flux" with the Korean intellectual property office, which is now pending with Korean laid-open publication No. 2002-92482.

In the accompanying drawings, FIG. 1 schematically shows a conventional inductively coupled RF (radio frequency) ion source 10' having a helical RF coil.

Referring to FIG. 1, the inductively coupled RF ion source 10' includes a plasma chamber 11' made of quartz. In addition, a gas feeding port 19' is formed at a top of the plasma chamber 11' in order to feed reaction gas into the plasma chamber 11'. An RF coil 14' is wound around the plasma chamber 11'. The RF coil 14' is connected to an RF matchbox 12', which is connected to an RF power supply 13' for supplying RF power.

In addition, a dual grid assembly 15' having a plurality of ion beam paths is provided at a bottom of the inductively coupled RF ion source 10' in order to control ions extracted from the plasma chamber 11'.

However, a great amount of ions may exist in an etching device using the ion beam source for performing an etching process and such ions may collide with a semiconductor substrate or material layers formed on the semiconductor substrate with hundreds of eV energy, thereby causing electrical damage or physical damage to the semiconductor substrate or the material layers formed on the semiconductor substrate.

To solve the above problem, applicant of the present invention has filed a patent application entitled "Neutral beam etching device" with the Korean intellectual property office, which is now allowed to applicant of the present invention with Korean Patent No. 10-412953.

The neutral beam etching device disclosed in the above patent includes an ion source having a plasma chamber for extracting ion beams, a dual grid assembly positioned at a bottom of the ion source, and a reflective member positioned at a lower end of the dual grid assembly.

However, the above neutral beam etching device must increase voltage applied to the grids in order to increase an amount of ions flux for improving etching performance.

That is, in order to increase an acceleration degree and a flow rate of ions passing through the grid assembly, the above neutral beam etching device must apply high voltage to the grids so that ion energy is also increased. However, if the ion energy is increased, kinetic energy of ions is also increased, so a semiconductor substrate may be damaged due to the ions making contact with the semiconductor substrate while an etching process is being carried out.

SUMMARY OF THE INVENTION

Accordingly, the present invention has been made to solve the above-mentioned problems occurring in the prior art, and an object of the present invention is to provide a neutral beam source having an electromagnet used for etching a semiconductor device, in which the electromagnet is installed around a plasma chamber so that a magnetic field is created around the plasma chamber, thereby improving plasma density and increasing an amount of ion flux.

In order to accomplish this object, there is provided a neutral beam source comprising: a plasma chamber having a quartz; a grid assembly; a reflective member; and a means for applying a magnetic field to the plasma chamber such that plasma density in the plasma chamber becomes high.

According to the preferred embodiment of the present invention, the magnetic field applying means includes an electromagnet arranged around the plasma chamber while surrounding the plasma chamber.

The electromagnet generates the magnetic field having intensity of about 20 to 60 gausses.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described in detail with reference to accompanying drawings.

Figure 1:
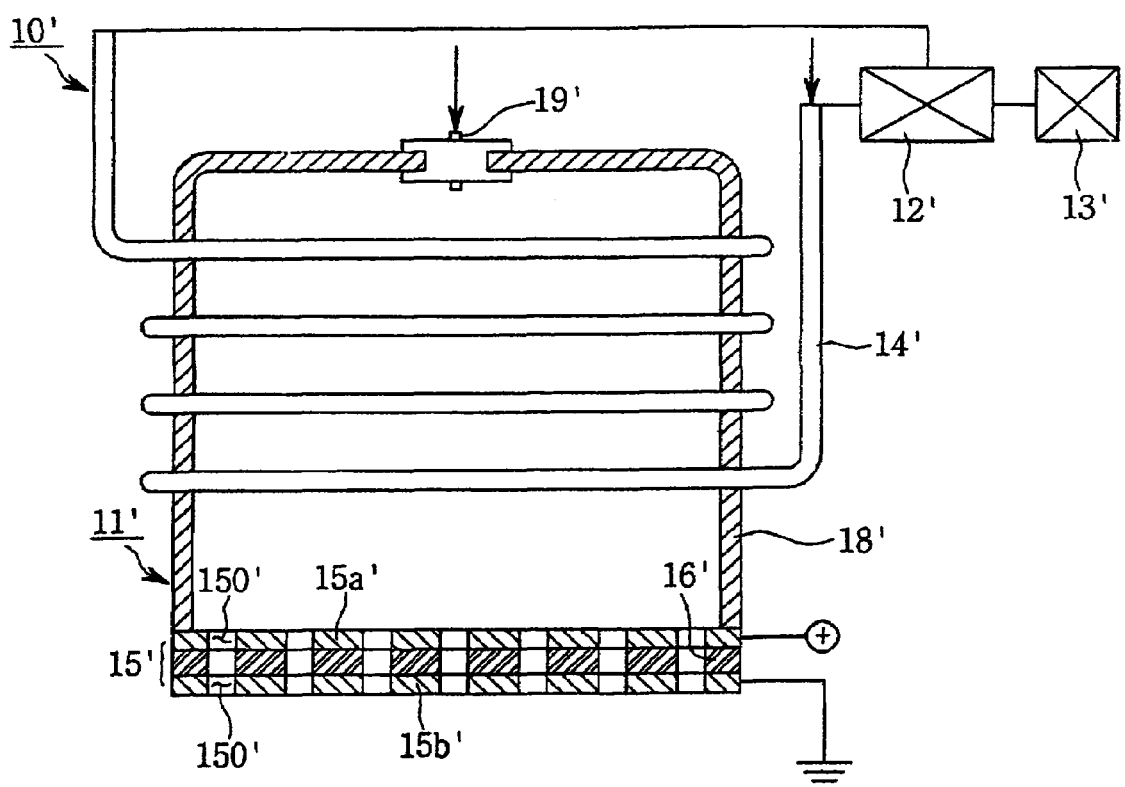
FIG. 1 is a view showing a conventional ion beam source.
Figure 2:
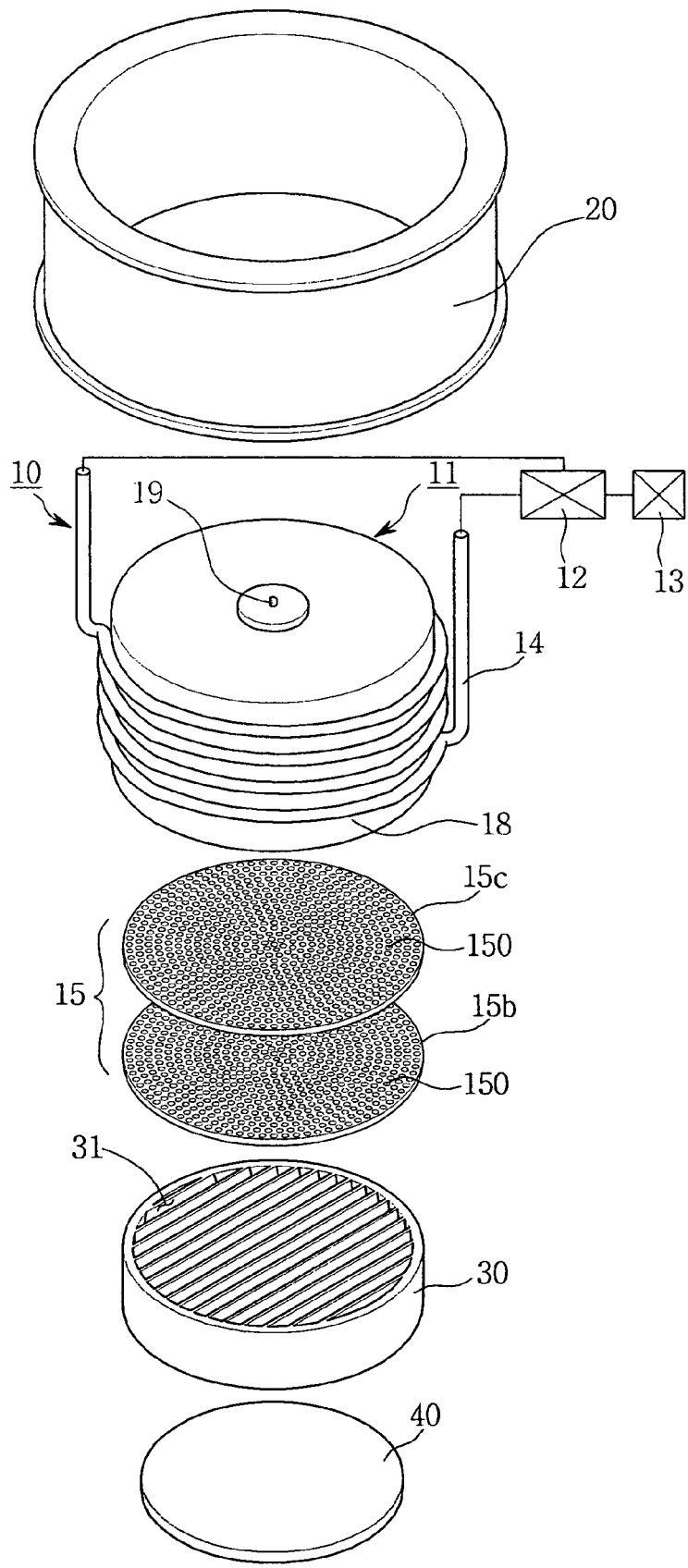
FIG. 2 is an exploded perspective view showing a neutral beam source having an electromagnet used for etching a semiconductor device according to one embodiment of the present invention.
Figure 3:
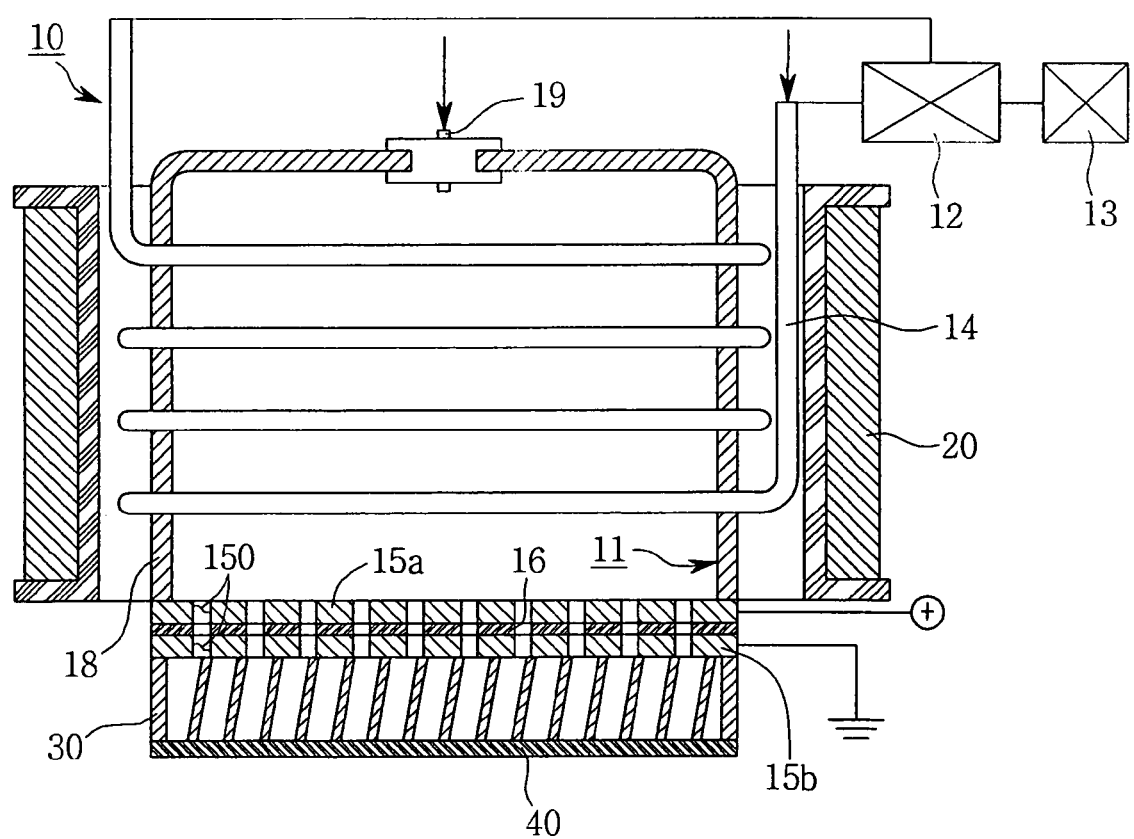
FIG. 3 is a sectional view of a neutral beam source according to one embodiment of the present invention.
Figure 4A:
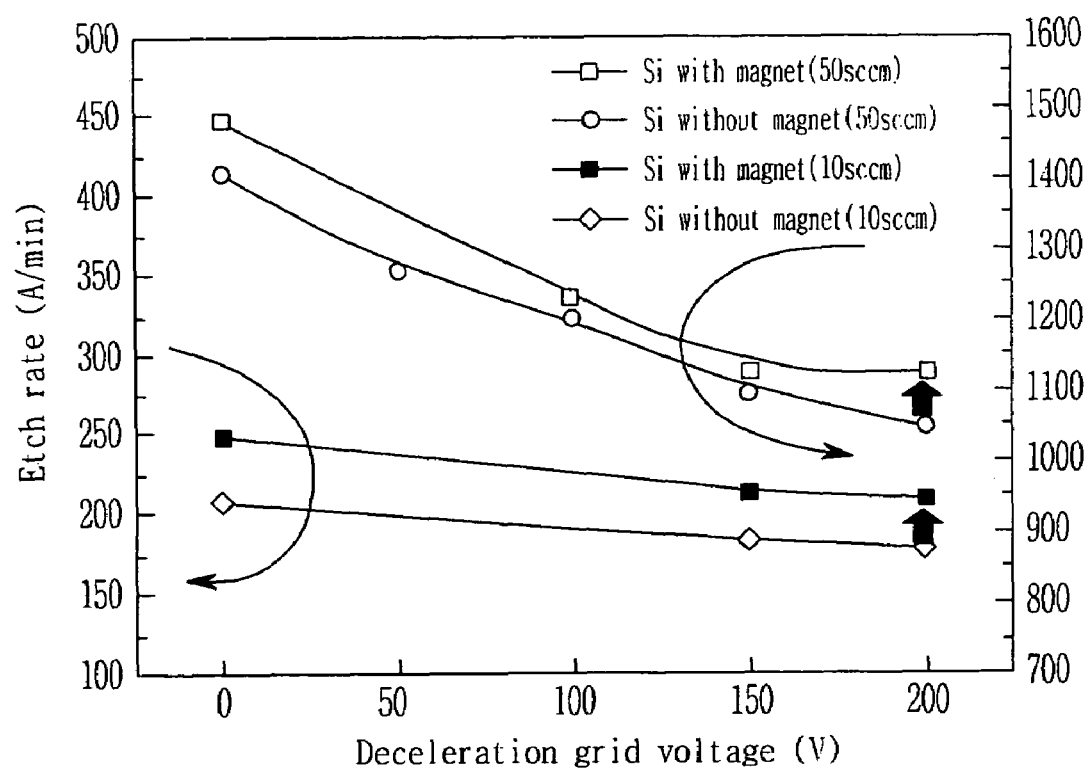
FIGS. 4A and 4B are graphs showing etch rates of Si and $SiO_2$ when Si and $SiO_2$ are etched by means of a neutral beam source of the present invention and a conventional neutral beam source.
Figure 4B:
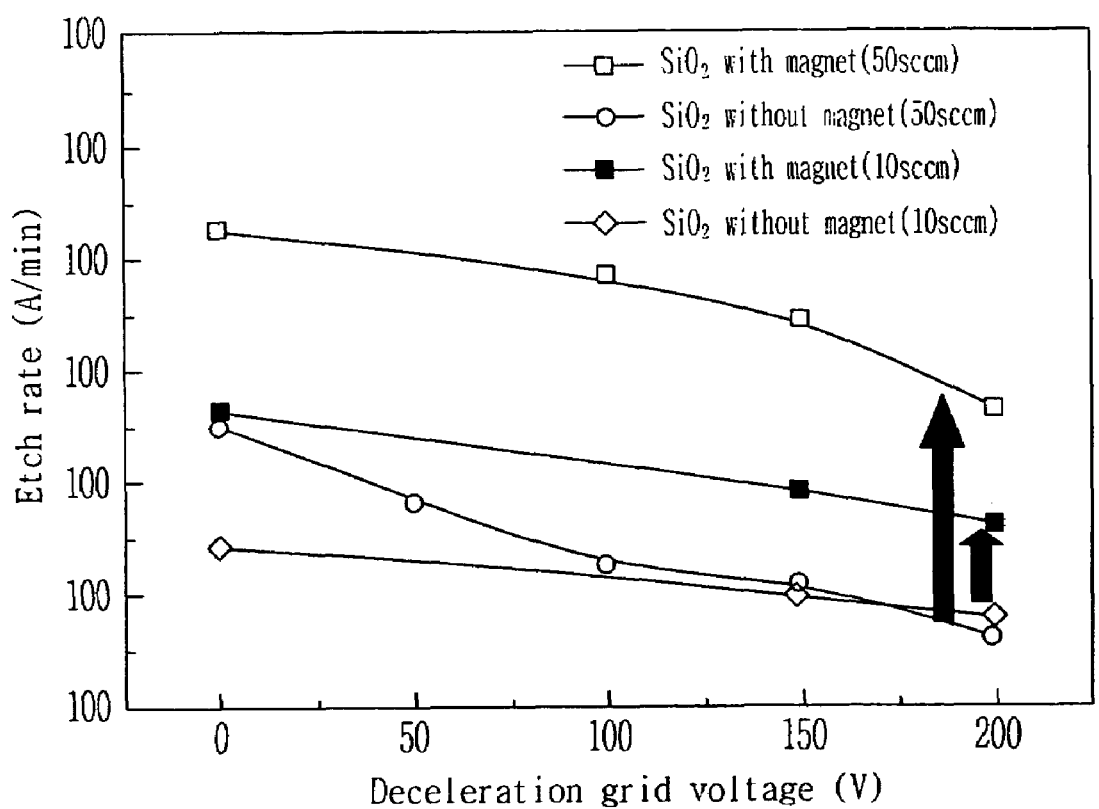

In the accompanying drawings, FIG. 2 is an exploded perspective view showing a neutral beam source having an electromagnet used for etching a semiconductor device according to one embodiment of the present invention, FIG. 3 is a sectional view of the neutral beam source according to one embodiment of the present invention, and FIGS. 4A and 4B are graphs showing etch rates of Si and $SiO_2$ when Si and $SiO_2$ are etched by means of the neutral beam source of the present invention and a conventional neutral beam source.

The present invention is an improvement of Korean Patent No. 10-412953 entitled "Neutral beam etching device" and allowed to applicant of the present invention, the contents of which are hereby incorporated by reference. The neutral beam source of the present invention includes an ion source, a grid assembly, and a reflective member disclosed in above Korean Patent No. 10-412953 as main components.

Besides above components, as shown in FIG. 2, an electromagnet 20 is arranged around a plasma chamber 11 having a quartz 18 which is provided at an outer wall thereof with an inductive coil 14. That is, the electromagnet 20 surrounds the plasma chamber 11. Accordingly, when power is applied to the plasma chamber 11, a magnetic field of predetermined intensity is applied to the plasma chamber 11.

Herein, the plasma chamber 11 has the quartz 18 formed at a top thereof with a gas feeding port (not shown) for feeding reaction gas into the plasma chamber 11 and the inductive coil 14 is wound around the quartz 18. The inductive coil 14 is connected to an RF matchbox 12, which is connected to an RF power supply 13 for supplying RF power.

In addition, a grid assembly 15 having a plurality of ion beam paths 150 is provided at a bottom of the plasma chamber 11 in order to control ions extracted from the plasma chamber 11.

According to the present invention, the grid assembly 15 includes first and second of grids 15a and 15b, which are overlapped with each other. The first grid 15a, which is an acceleration grid and adjacent to the plasma chamber 11, is connected to a positive voltage power supply capable of supplying high positive voltages in a range from tens of voltages to hundreds of voltages. The second grid 15b, which is a deceleration grid and positioned below the first grid 15a, is grounded so that the second grid 15b maintains a "0 voltage" state.

Accordingly, a strong electric field is formed due to a voltage difference between the first and second grids 15a and 15b, and the ions extracted from the plasma chamber 11 are accelerated by the strong electric field.

An insulation area 16 made of insulation material is formed between first and second grids 15a and 15b. At this time, the insulation area 16 is located between outer peripheral portions of the first and second grids 15a and 15b such that ion beam paths 150 formed in the first and second grids 15a and 15b are communicated with each other.

The insulation material is any one selected from the group consisting of oxide-based material having dielectric constant of about 3 to 5, nitride-based material having dielectric constant of about 6 to 9, ferroelectric material having several tens of dielectric constant, and mixtures thereof.

In addition, a reflective member 30 is closely adjacent to a bottom portion of the grid assembly 15 in order to convert an ion beam into a neutral beam by reflecting the ion beam. The reflective member 30 includes a semiconductor substrate, $SiO_2$, or a metal substrate. It is also possible to use the above material only for an upper surface of the reflective member 30 defined by reflective holes 31.

The reflective member 30 is described in Korean Patent No. 10-412953 entitled "neutral beam etching device" in detail, so it will not be further described below.

According to the present invention, the magnetic field is created by the electromagnet arranged around the plasma chamber so that a motion of electrons in plasma can be controlled, thereby improving density of plasma and increasing an amount of ion flux.

When etching Si and $SiO_2$ by using the neutral beam source of the present invention while varying intensity of the magnetic field generated by the electromagnet in a range between 20 gausses to 60 gausses, an etch rate is increased, and then, decreased. When the magnetic field has intensity of about 20 gausses, a highest etch rate is resulted.

Accordingly, an etch rate test has been carried out by varying voltages applied to the deceleration grid after applying the magnetic field having intensity of about 20 gausses to the plasma chamber. The test result is shown in FIGS. 4A and 4b.

The test is carried out under the conditions of RF power 1 KW, etching gas $SF_6$, constant flow rate 10 sccm (standard cubic centimeter per minute, 1 sccm=1 $cm^3$/min) and 50 sccm.

As shown in FIGS. 4A and 4b, when the magnetic field having intensity of about 20 gausses is applied to the plasma chamber, the etch rate of the Si and $SiO_2$ is increased as compared with a case in which the magnetic field is not applied to the plasma chamber. Particularly, in a case of $SiO_2$, if the magnetic field having intensity of about 20 gausses is applied to the plasma chamber at a high flow rate, the etch rate is increased about 2 times as compared with the etch rate of $SiO_2$, in which the magnetic field is not applied to the plasma chamber. According to the present invention, a high etch rate in a range between 170 to 250 A/min can be obtained.

Such an increase of the etch rate by the magnetic field represents that flux of neutral beam is increased as plasma density becomes high.

As described above, the neutral beam source having the electromagnet according to the present invention, which is an improvement of Korean Patent No. 10-412953 entitled "Neutral beam etching device", can improve plasma density by applying the magnetic field to the plasma chamber, thereby increasing an amount of ion flux and improving the etch rate.

Although a preferred embodiment of the present invention has been described for illustrative purposes, those skilled in the ail will appreciate that various modifications, additions and substitutions are possible, without departing from the scope and spirit of the invention as disclosed in the accompanying claims.

What is claimed is:

1. A neutral beam source comprising:
   a plasma chamber configured to produce ions;
   a grid assembly having a plurality of ion paths and arranged to receive the ions from the plasma chamber;
   a reflective member arranged to receive and neutralize ions directed by the grid assembly; and
   a means for applying a magnetic field to the plasma chamber to increase plasma density of the ions in the plasma chamber.

2. The neutral beam source as claimed in claim 1, wherein the magnetic field applying means includes an electromagnet arranged around and surrounding the plasma chamber.

3. The neutral beam source as claimed in claim 2, wherein the electromagnet generates the magnetic field having an intensity of about 20 to 60 gausses.

4. The neutral beam source as claimed in claim 1, wherein the grid assembly is connected to a voltage source.

5. The neutral beam source as claimed in claim 1, wherein the grid assembly is configured to accelerate the ions received from the plasma chamber.

6. The neutral beam source as claimed in claim 1, wherein the plasma chamber comprises quartz walls.

7. A neutral beam source comprising:
   a plasma chamber configured to produce ions;
   a grid assembly having a plurality of ion paths and arranged to receive the ions from the plasma chamber;

a reflective member arranged to receive and neutralize ions directed by the grid assembly; and an electromagnet arranged to increase plasma density of the ions in the plasma chamber.

8. The neutral beam source as claimed in claim 7, wherein the plasma chamber comprises quartz walls.

* * * * *